United States Patent
Hirasawa

(10) Patent No.: US 9,051,130 B2
(45) Date of Patent: Jun. 9, 2015

(54) TRANSPORT UNIT AND TRANSPORT APPARATUS

(71) Applicant: Hirata Corporation, Shinagawa-ku (JP)

(72) Inventor: Yoichi Hirasawa, Shinagawa-ku (JP)

(73) Assignee: HIRATA CORPORATION, Tokyo (JP)

( * ) Notice: Subject to any disclaimer, the term of this patent is extended or adjusted under 35 U.S.C. 154(b) by 102 days.

(21) Appl. No.: 13/787,930

(22) Filed: Mar. 7, 2013

(65) Prior Publication Data

US 2013/0259628 A1    Oct. 3, 2013

(30) Foreign Application Priority Data

Mar. 29, 2012    (JP) .................................. 2012-077770

(51) Int. Cl.
  *B65G 47/24* (2006.01)
  *H01L 21/677* (2006.01)

(52) U.S. Cl.
  CPC .......... *B65G 47/24* (2013.01); *H01L 21/67706* (2013.01); *H01L 21/6773* (2013.01)

(58) Field of Classification Search
  USPC .......... 198/345.1, 345.3, 346.1, 346.2, 468.2;
      269/303; 29/33 P, 559; 409/225;
      414/217, 217.1, 222.04, 222.05,
      414/222.06, 222.07, 277, 278, 411, 771,
      414/775, 780, 781, 936; 83/412
  See application file for complete search history.

(56) References Cited

U.S. PATENT DOCUMENTS

| | | | | |
|---|---|---|---|---|
| 4,239,445 A | * | 12/1980 | Ozawa | 414/749.6 |
| 4,456,418 A | * | 6/1984 | Harter et al. | 414/351 |
| 4,493,412 A | * | 1/1985 | Krehnovi | 198/434 |
| 4,898,268 A | * | 2/1990 | Kamioka et al. | 198/345.1 |
| 4,998,712 A | * | 3/1991 | Park et al. | 269/25 |
| 5,301,788 A | * | 4/1994 | Hironaka et al. | 198/346.1 |
| 5,829,571 A | * | 11/1998 | Mizuta et al. | 198/345.1 |
| 7,314,344 B2 | * | 1/2008 | Chen et al. | 414/763 |
| 7,376,486 B2 | * | 5/2008 | Kuribara et al. | 700/213 |
| 7,559,419 B2 | * | 7/2009 | Unterhuber | 198/345.3 |
| 7,591,068 B2 | * | 9/2009 | Kawazoe et al. | 29/832 |

(Continued)

FOREIGN PATENT DOCUMENTS

CN    101801816 A    8/2010
CN    202163870 U    3/2012

(Continued)

OTHER PUBLICATIONS

Office Action (Results of Examination) issued on Jul. 28, 2014, by the Korean Patent Office in corresponding Korean Application No. 10-2013-0031906, and a partial English translation of the Office Action. (5 pages).

(Continued)

*Primary Examiner* — Gregory Adams

(74) *Attorney, Agent, or Firm* — Buchanan Ingersoll & Rooney PC

(57) ABSTRACT

The present invention provides a transport unit comprising a base member, a transport mechanism and a positioning mechanism. The base member includes a bottom wall extending in a transport direction and a pair of side walls standing upright from two side portions, respectively, of the bottom wall. The transport mechanism is supported by the base member and transports an object to be transported. The positioning mechanism is supported by the base member, and positions the object relative to the base member.

10 Claims, 13 Drawing Sheets

(56) References Cited

U.S. PATENT DOCUMENTS

| | | | |
|---|---|---|---|
| 7,862,284 B2 * | 1/2011 | Kiriyama | 414/222.01 |
| 2010/0133064 A1 * | 6/2010 | Kondo | 198/349 |

FOREIGN PATENT DOCUMENTS

| | | |
|---|---|---|
| CN | 202163871 U | 3/2012 |
| EP | 1231168 A1 | 8/2002 |
| JP | 5-82939 U | 11/1993 |
| JP | 7-29484 U | 6/1995 |
| JP | H09-260462 A | 10/1997 |
| JP | 2000-258497 A | 9/2000 |
| KR | 10-0292934 B1 | 6/2001 |

OTHER PUBLICATIONS

Office Action issued on Jan. 21, 2015, by the Chinese Patent Office in corresponding Chinese Application No. 201310105980.7 (8 pages).

* cited by examiner

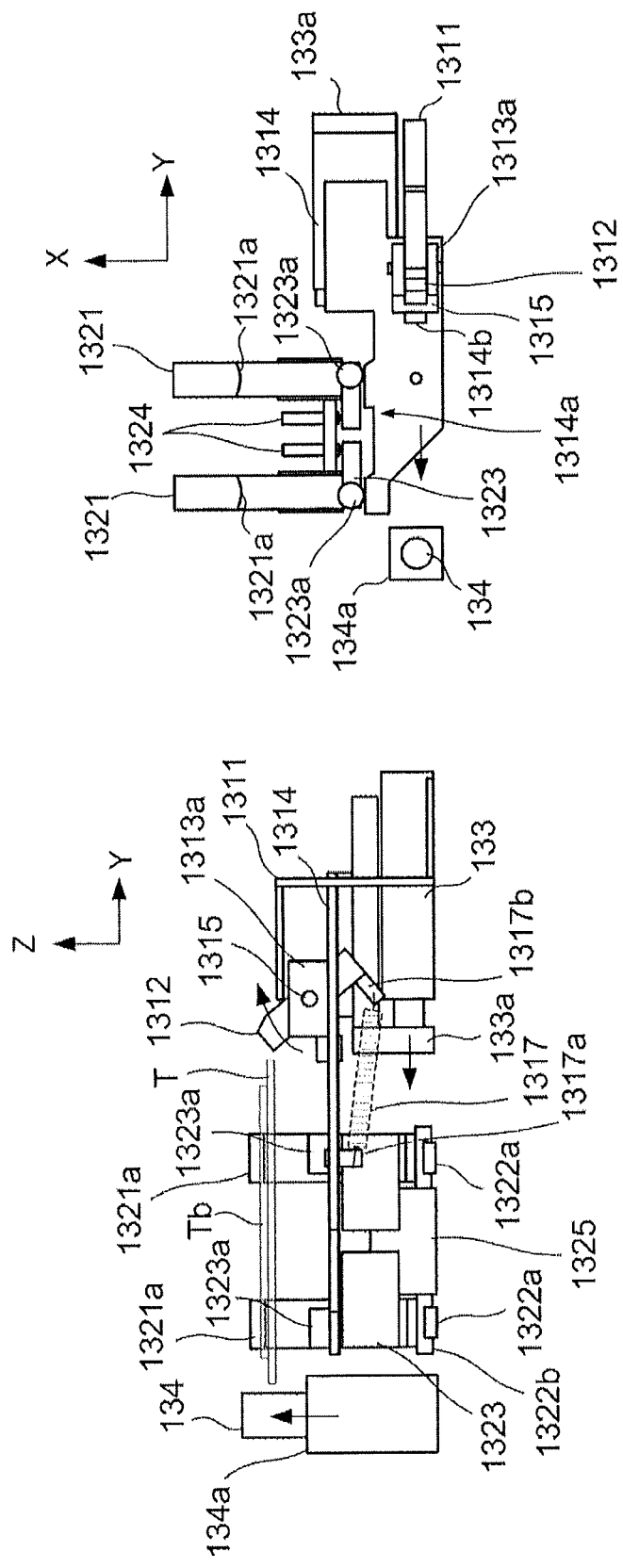

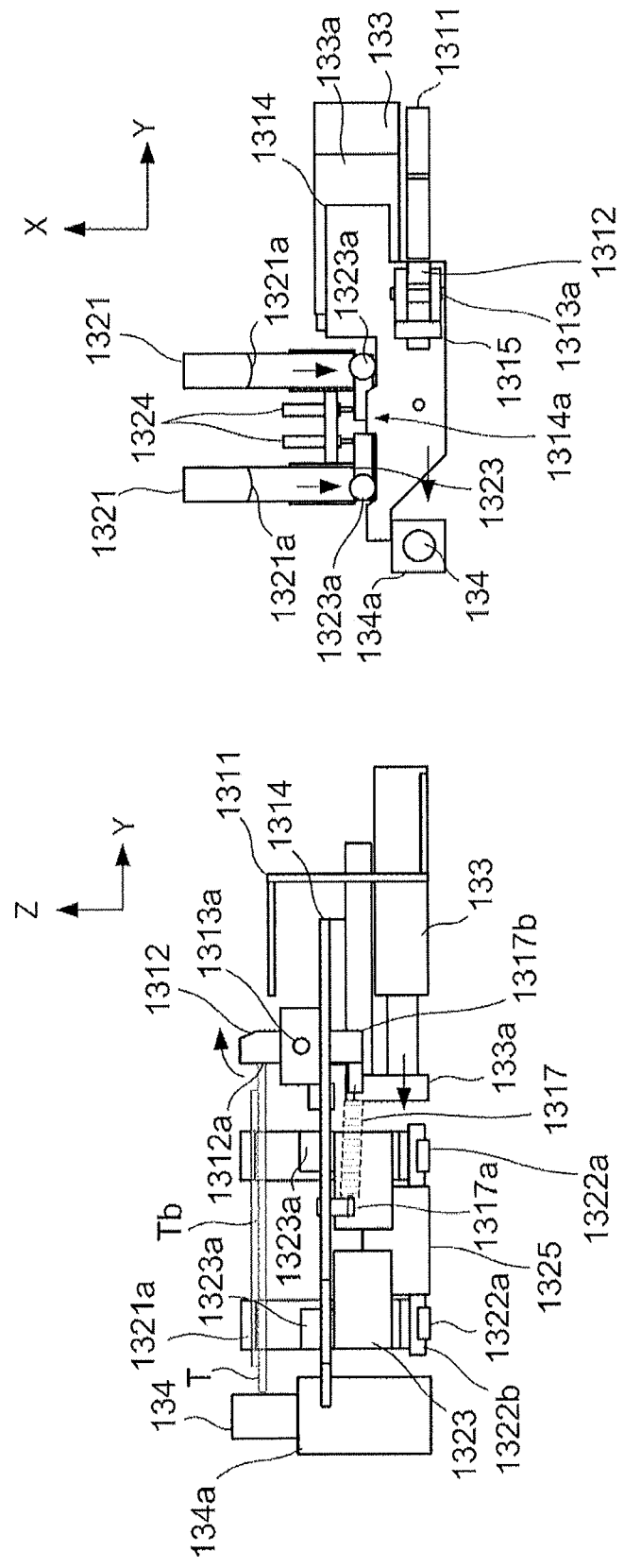

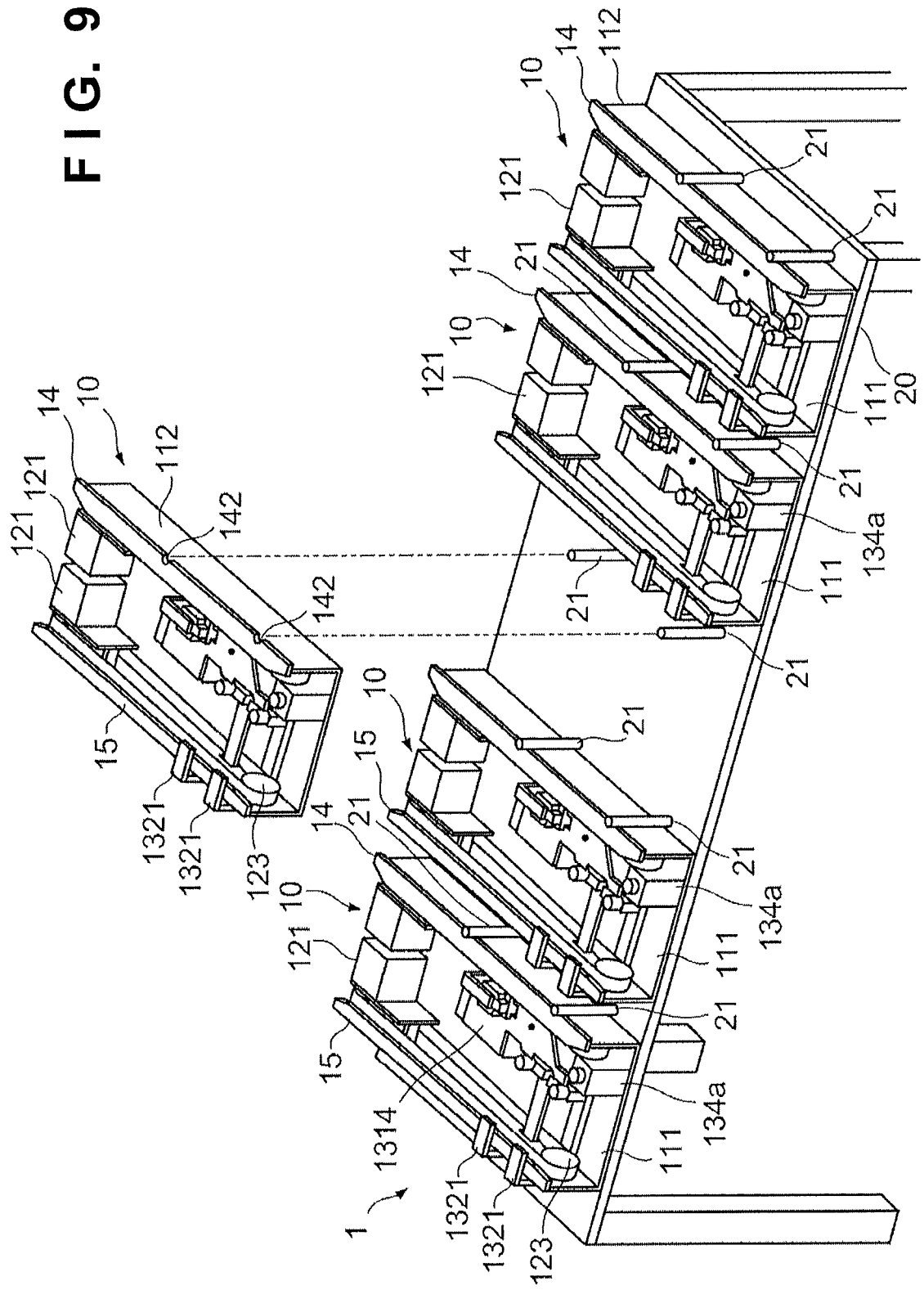

F I G. 10
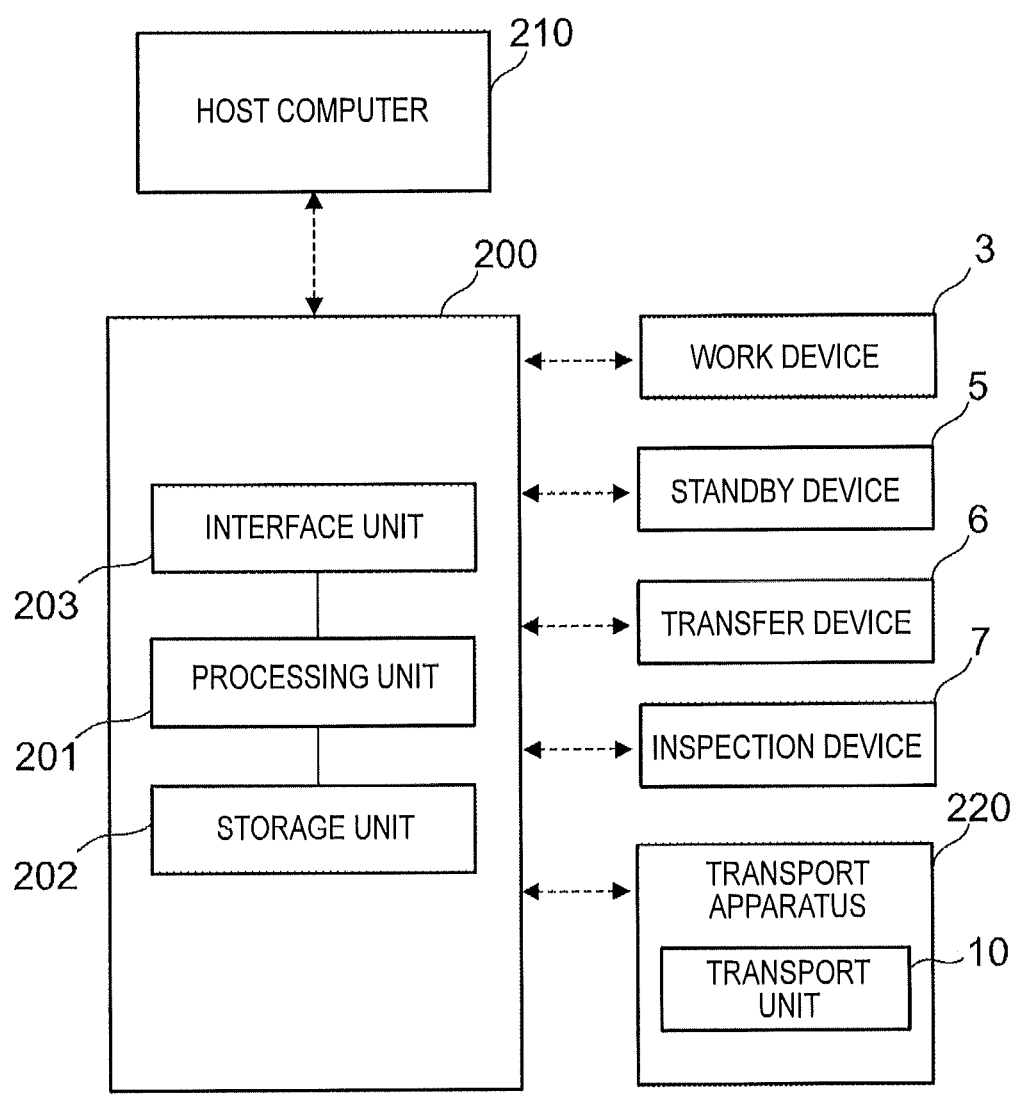

TRANSPORT UNIT AND TRANSPORT APPARATUS

BACKGROUND OF THE INVENTION

1. Field of the Invention

The present invention relates to a technique of transporting an object to be transported.

2. Description of the Related Art

When an object to be transported is transferred to a predetermined position, it must often be positioned with high accuracy. Hence, an apparatus including a transport mechanism and positioning mechanism has been proposed. Japanese Patent Laid-Open No. 2000-258497, for example, discloses an apparatus including a belt conveyor which transports a pallet on which a plurality of chips are mounted, and a mechanism which positions the pallet. Japanese Utility Model Laid-Open No. 5-82939 discloses a conveyor including a pallet positioning device. Moreover, Japanese Utility Model Laid-Open No. 7-29484 discloses a conveyor including a tray positioning mechanism.

The transport mechanism and positioning mechanism require periodical maintenance. Also, when these mechanisms have broken down, they require repair and replacement. Since such maintenance and other operations must be done while the system is kept stopped, they preferably take only a short period of time. Furthermore, when a broken transport mechanism or positioning mechanism is replaced, it requires position adjustment relative to other system components. This position adjustment operation prolongs the system downtime.

SUMMARY OF THE INVENTION

It is an object of the present invention to provide a transport unit and transport apparatus which can prevent prolongation of the system downtime.

According to an aspect of the present invention, there is provided a transport unit comprising: a base member including a bottom wall extending in a transport direction, and a pair of side walls standing upright from two side portions, respectively, of the bottom wall; a transport mechanism which is supported by the base member, and transports an object to be transported; and a positioning mechanism which is supported by the base member, and positions the object, transported by the transport mechanism, relative to the base member.

According to another aspect of the present invention, there is provided a transport apparatus including a transport unit, and a mount table on which the transport unit is mounted, the transport unit including a base member including a bottom wall extending in a transport direction, and a pair of side walls standing upright from two side portions, respectively, of the bottom wall, a transport mechanism which is supported by the base member, and transports an object to be transported, and a positioning mechanism which is supported by the base member, and positions the object, transported by the transport mechanism, relative to the base member, and the mount table including a positioning reference portion against which the object abuts, and a press mechanism which presses the object toward the positioning reference portion.

According to still another aspect of the present invention, there is provided a transport apparatus including a transport unit, and a mount table on which the transport unit is mounted, the transport unit including a base member including a bottom wall extending in a transport direction, and a pair of side walls standing upright from two side portions, respectively, of the bottom wall, a transport mechanism which is supported by the base member, and transports an object to be transported, a positioning mechanism which is supported by the base member, and positions the object, transported by the transport mechanism, relative to the base member, and a reference member fixed to the base member, and the mount table including an engaging member which defines a mount position of the transport unit, the reference member including a positioning reference portion against which the object abuts, and a portion to be engaged, with which the engaging member engages, and the positioning mechanism including a press mechanism which presses the object toward the positioning reference portion.

Further features of the present invention will become apparent from the following description of exemplary embodiments with reference to the attached drawings.

BRIEF DESCRIPTION OF THE DRAWINGS

FIGS. 7A and 7B are views for explaining the operation of the positioning mechanism shown in FIGS. 5A and 5B;

FIGS. 8A and 8B are views for explaining the operation of the positioning mechanism shown in FIGS. 5A and 5B;

FIG. 9 is a perspective view showing a mode in which an old transport unit is replaced in the transport apparatus shown in FIG. 2;

FIG. 10 is a block diagram showing a control device for the work system shown in FIG. 1;

DESCRIPTION OF THE EMBODIMENTS

First Embodiment

<Work System>

Figure 1:
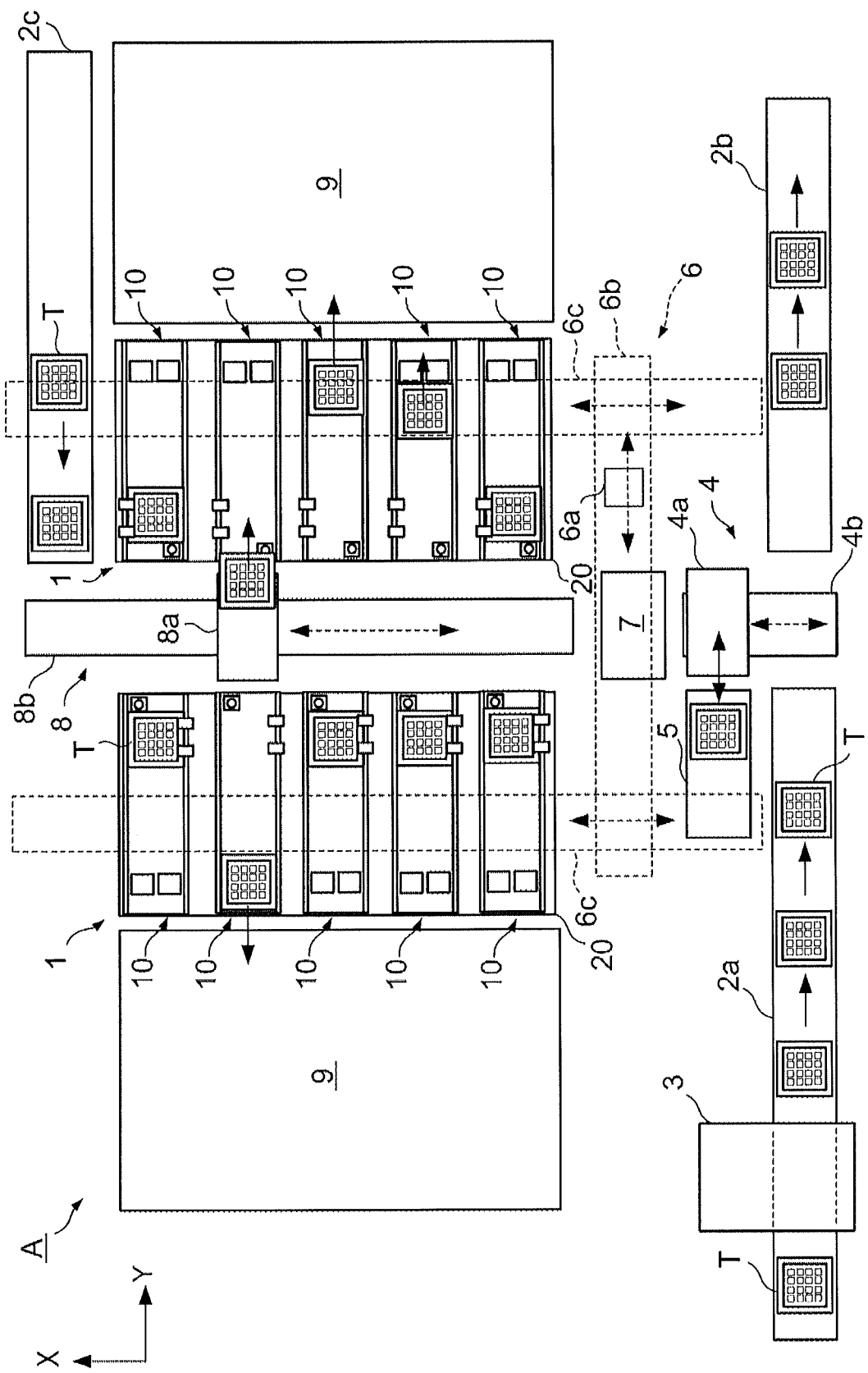
FIG. 1 is a diagram showing the layout of a work system as an application example of the present invention.

FIG. 1 is a diagram showing the layout of a work system A as an application example of the present invention. The work system A performs a predetermined work and inspection for components (not shown) on a tray T, and includes transport apparatuses 1 and transport units 10 according to an embodiment of the present invention. The components are, for example, IC chips. The operation of the work system A will briefly be described below. Note that in the accompanying drawings, the X- and Y-directions are orthogonal horizontal directions, and the Z-direction is the vertical direction.

A transport device 2a is, for example, a belt conveyor, and transports, in the Y-direction, the tray T on which a plurality of components are mounted. A work device 3 is disposed in the middle of the transport path of the transport device 2a. The work device 3 picks up the components on the tray T which is positioned in the transport path and stopped in transport, performs a predetermined work, and returns them onto the tray T. Examples of the operation details include heating and cleaning of the components.

A transport device 4 includes a transport section 4a which transports the tray T in the Y-direction, and a driving unit 4b which reciprocally moves the transport section 4a in the X-direction. The transport section 4a is, for example, a belt conveyor. The transport section 4a receives the tray T from the transport device 2a, and supplies it to a standby device 5. Further, the transport section 4a receives the tray T from the standby device 5, and transfers it to a transport device 2b. The transport device 2b is, for example, a belt conveyor, and transports, in the Y-direction, an empty tray T and a tray T on which defective components are mounted.

The standby device 5 includes, for example, a belt conveyor, and allows the tray T supplied from the transport device 4 to stand by on itself. A transfer device 6 transports the components on the tray T standing by on the standby device 5 to an inspection device 7. The transfer device 6 serves as a gantry robot, and includes a transfer mechanism 6b which ascends/descends in the Z-direction and reciprocally moves a hand portion 6a in the Y-direction, and a pair of transfer mechanisms 6c which move the transfer mechanism 6b in the X-direction.

The inspection device 7 inspects and measures the components. The transfer device 6 returns components, determined to be unfit upon inspection by the inspection device 7, onto the tray T on the standby device 5 as unfit components. The transfer device 6 transports fit components onto the trays T positioned on the transport units 10.

After inspection operations of all components mounted on the tray T on the standby device 5 are completed, the standby device 5 returns the tray T to the transport device 4. The transport device 4 transports and transfers the tray T returned from the standby device 5 to the transport device 2b.

A transport device 2c is, for example, a belt conveyor, and transports an empty tray T from a stocker (not shown) to a transport device 8. The transport device 8 includes a transport section 8a which transports the tray T in the Y-direction, and a driving unit 8b which reciprocally moves the transport section 4a in the X-direction. The transport section 8a supplies the empty tray T to each transport unit 10.

Each transport apparatus 1 includes a plurality of transport units 10. In this embodiment, two transport apparatuses 1 are arranged on the two sides of the driving unit 8b in the Y-direction, and each transport apparatus 1 includes five transport units 10 arrayed in the X-direction.

Each transport unit 10 positions an empty tray T first as it is supplied from the transport device 8. Then, the transfer device 6 transports components onto the tray T. When a predetermined number of components are stacked on the tray T, the tray T is transported to a succeeding device 9 (in the Y-direction). The device 9 is, for example, a stocker for the tray T.

In this way, the work system A can automate a predetermined work and inspection of the components, and accommodation of the components on the tray T.

<Transport Apparatus>

Figure 2:
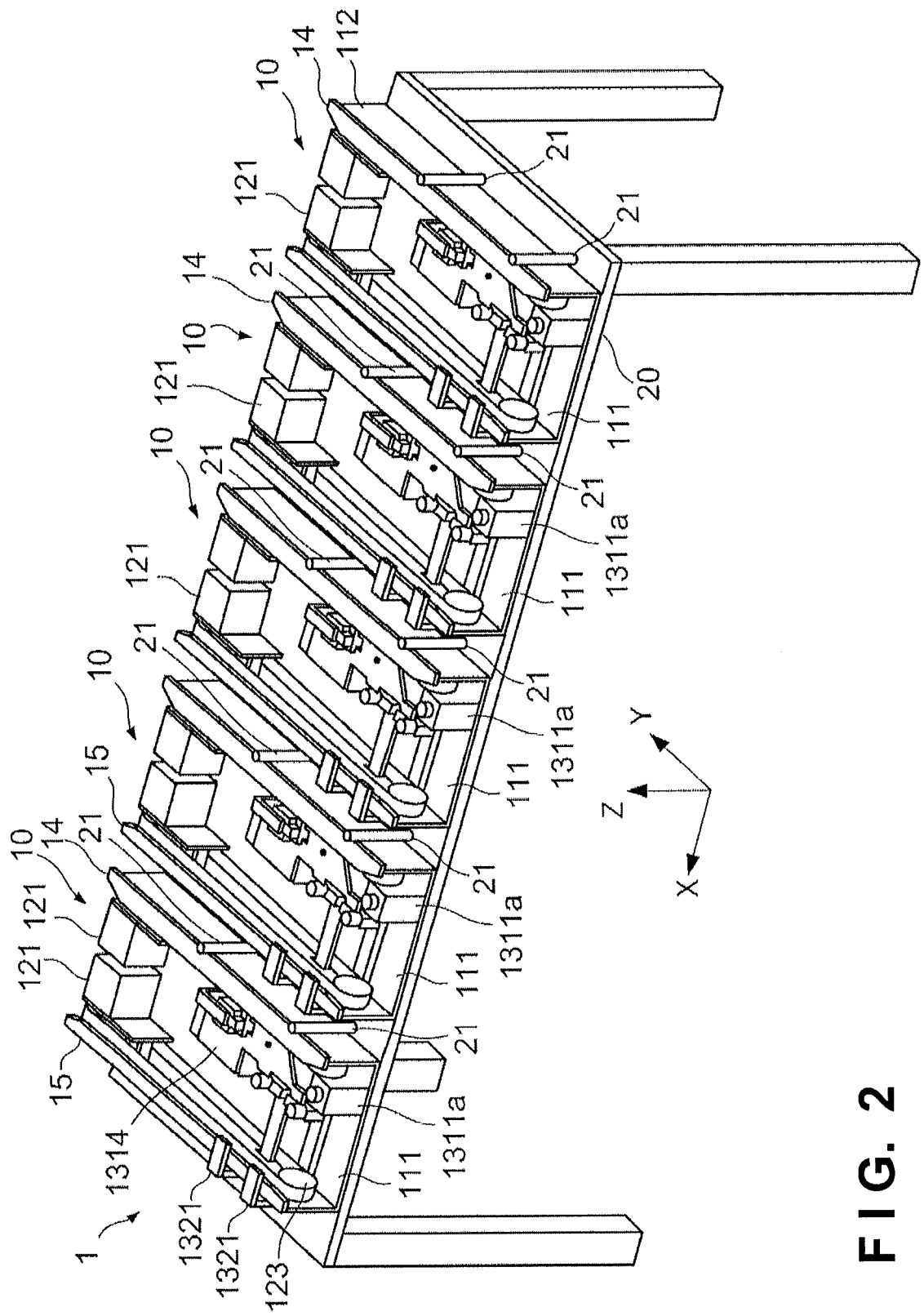
FIG. 2 is a perspective view showing a transport apparatus according to an embodiment of the present invention.

FIG. 2 is a perspective view showing the transport apparatus 1. The transport apparatus 1 includes a plurality of transport units 10, and a mount table 20 on which the transport units 10 are mounted. The mount table 20 has an upper surface which serves as a flat mount surface, and the transport units 10 are mounted on the mount surface. Each transport unit 10 is removably fixed to the mount table 20 by a fixing structure such as a screw.

The mount table 20 includes engaging members 21. In this embodiment, two engaging members 21 are used for one transport unit 10. Again in this embodiment, the engaging members 21 are circular cylinders standing upright on the mount surface. The engaging members 21 define the mount positions of the transport units 10 on the mount table 20. In other words, the engaging members 21 serve to position the transport units 10. Also, by positioning each transport unit 10 on the mount table 20, the tray T to be positioned on this transport unit 10 is also positioned relative to the mount table 20.

In a configuration in which each transport unit 10 is fixed to the mount table 20 using a screw, the rough position of the transport unit 10 relative to the mount table 20 can be defined by a hole into which a screw is inserted. However, the accuracies of the position and size of a hole into which a screw is inserted are relatively low. Hence, providing the engaging members 21 makes it possible to improve the positioning accuracy of the tray T. Details of this mechanism will be described later.

<Transport Unit>

Figure 3:
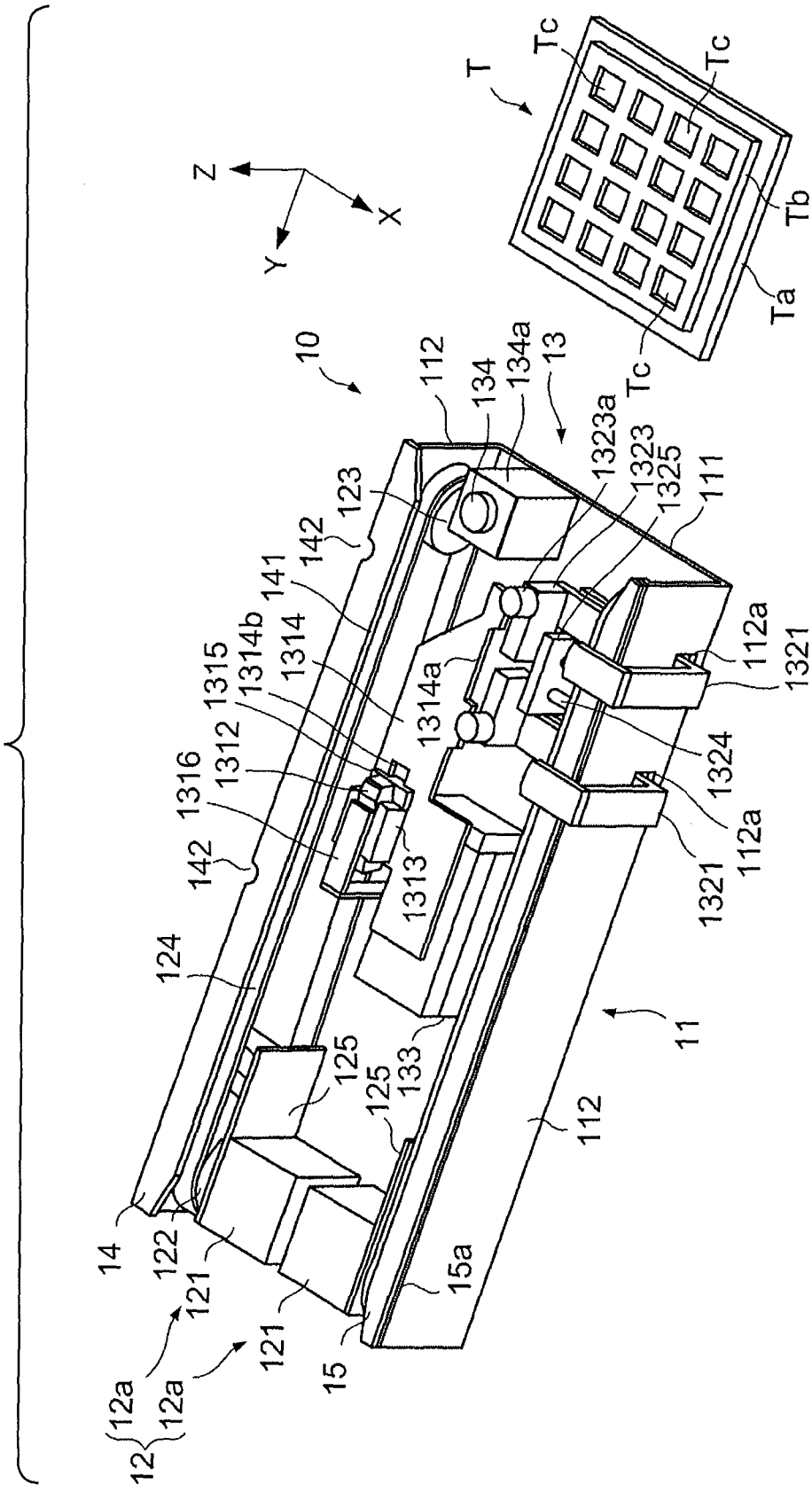
FIG. 3 is a perspective view showing a transport unit according to the embodiment of the present invention.
Figure 4:
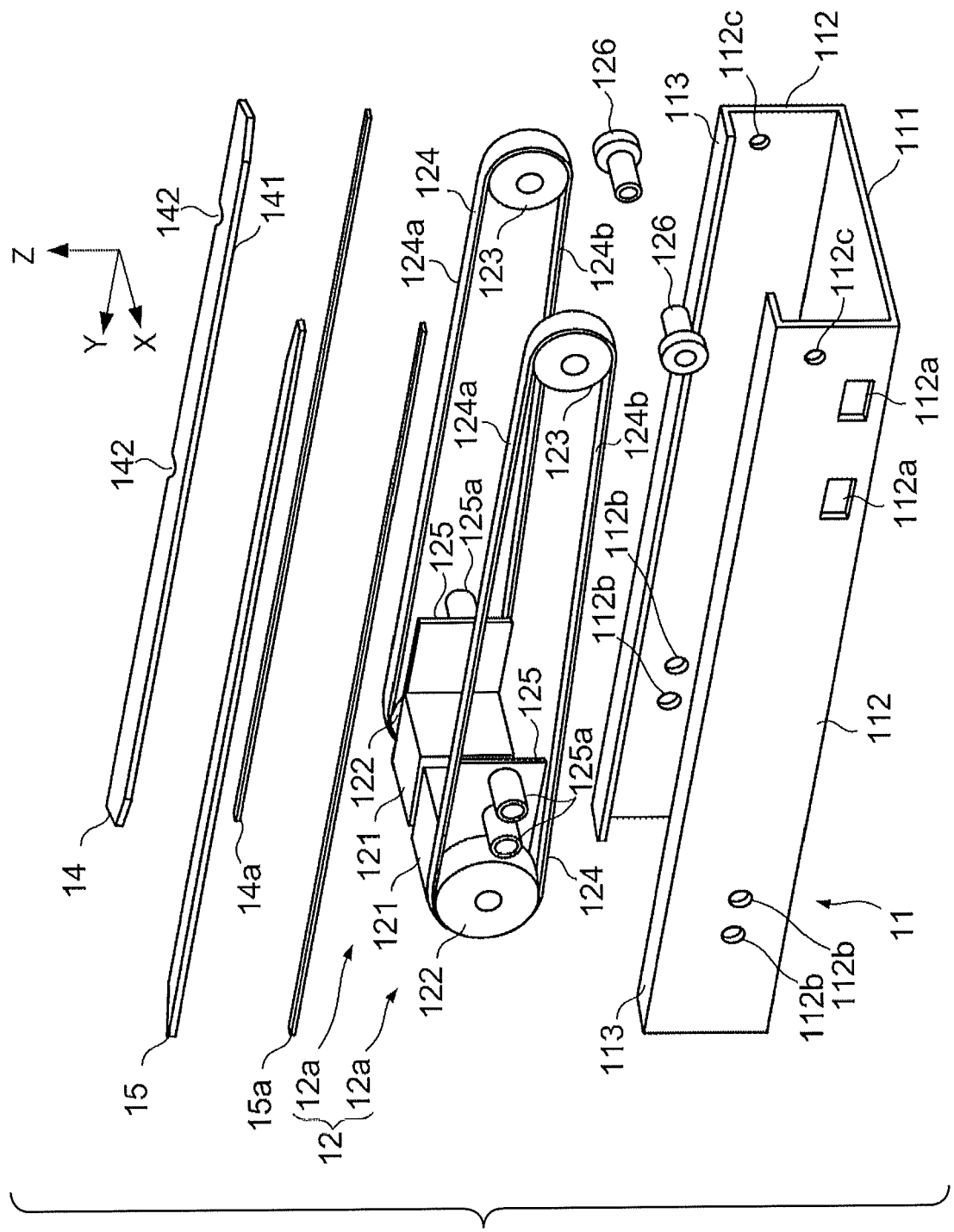
FIG. 4 is a partially exploded perspective view of the transport unit shown in FIG. 3.
Figure 5A:
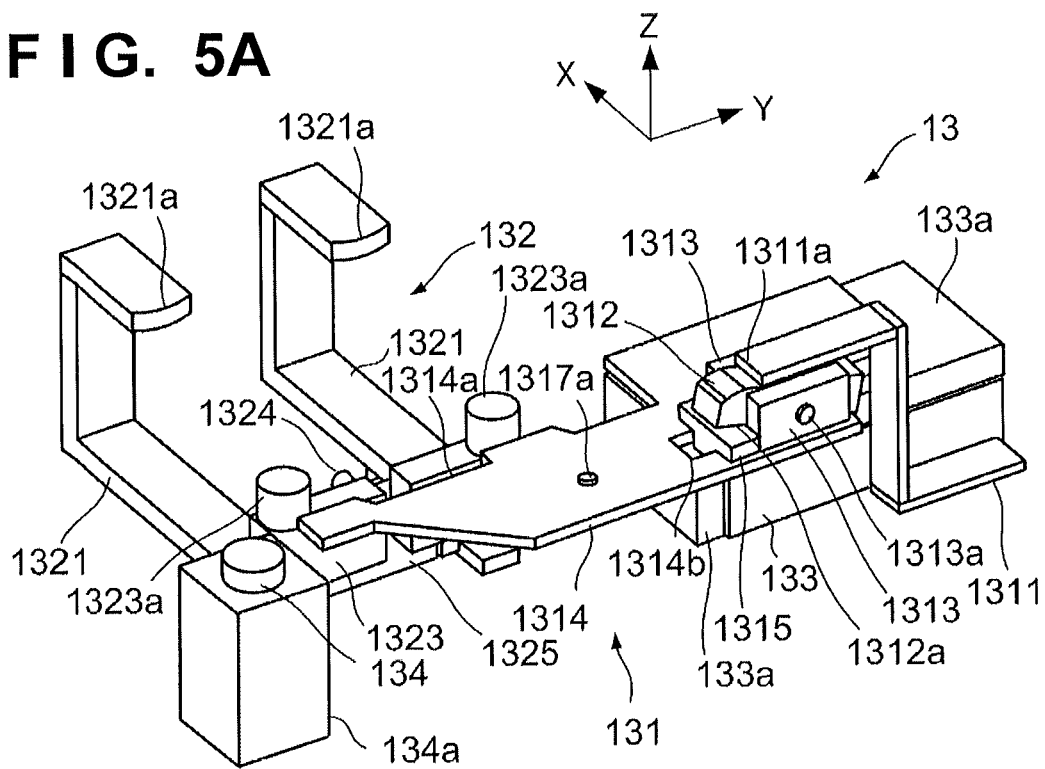
FIGS. 5A and 5B are perspective views showing a positioning mechanism.
Figure 5B:
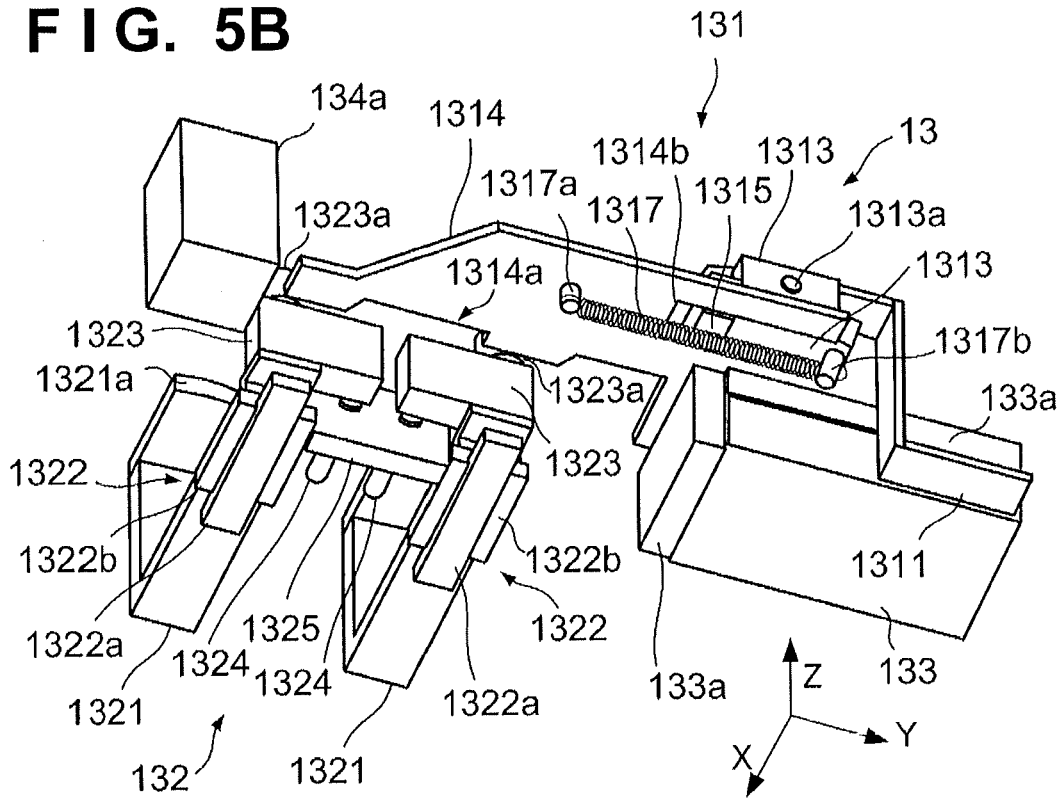

The configuration of the transport unit 10 will be described with reference to FIGS. 3 to 5B. FIG. 3 is a perspective view showing the transport unit 10 and tray T. FIG. 4 is a partially exploded perspective view of the transport unit 10, and mainly shows a base member 11 and a transport mechanism 12. FIGS. 5A and 5B are perspective views showing a positioning mechanism 13, in which FIG. 5A is a perspective view as viewed from above; and FIG. 5B is a perspective view as viewed from below.

The transport unit 10 includes the base member 11, the transport mechanism 12, the positioning mechanism 13, and guide members 14 and 15.

The base member 11 includes a bottom wall 111 which extends in the transport direction (Y-direction), a pair of side walls 112 which stand upright from the two side portions of the bottom wall 111 in the X-direction, and edge portions 113 which project to the interior of the base member 11 (toward the opposed side walls 112) in the upper portions of the side walls 112. The base member 11 has a C cross-sectional shape that opens on its upper portion, and has a cylindrical shape with its two ends in the Y-direction opening as a whole. Hence, an internal space is formed inside the base member 11. The base member 11 can be formed by, for example, bending a metal plate by, for example, press working, and integrally molding the bent portions.

The guide members 14 and 15 are fixed onto the edge portions 113 with spacers 14a and 15a sandwiched between them. The guide members 14 and 15 guide movement of the tray T to prevent the tray T from meandering during transport.

Note that the tray T has a square plate shape as a whole, and integrally includes a square bottom plate portion Ta, and a square stage portion Tb higher than the bottom plate portion Ta by one step, as shown in FIG. 3. Recessed portions Tc which receive components are formed in the upper surface of the stage portion Tb in a matrix. The distance across which the inner side surfaces of the guide members 14 and 15 are spaced apart from each other is set slightly larger than the side of the stage portion Tb. The guide members 14 and 15 guide the stage portion Tb (its side surfaces) to prevent the tray T from meandering.

Note that the guide members 14 and 15 can also guide the bottom plate portion Ta instead of the stage portion Tb.

The spacers 14a and 15a are members for position adjustment of the guide members 14 and 15, respectively, in the Z-direction. The spacers 14a and 15a adjust the positions of the guide members 14 and 15 in the Z-direction so that the position (level), in the Z-direction, of the stage portion Tb of the tray T transported by the transport mechanism 12 becomes level with that of the guide members 14 and 15. The guide members 14 and 15 include guide portions which project from the spacers 14a and 15a to which they are respectively fixed, and guide the tray T, and are removably fixed to the edge portions 113 by a fixing structure such as a screw. The bottom plate portion Ta is positioned on the lower side of each of the guide members 14 and 15 to allow transport movement.

In this embodiment, the guide member 14 includes two portions to be engaged 142 which engage with the two engaging members 21, respectively, of the mount table 20, and a positioning reference portion 141 which serves as a reference for positioning by the positioning mechanism 13. Hence, the guide member 14 is a reference member that serves as a reference for the position of the tray T relative to the mount table 20.

The portions to be engaged 142 are semicircular notches, which engage with the circumferential surfaces of the engaging members 21 as circular cylinders. The position of the transport unit 10 in the X- and Y-directions can be defined by forming the portions to be engaged 142 into a semicircular shape, while the orientation (direction) of the transport unit 10 in the horizontal plane can be defined by providing the two portions to be engaged 142. This facilitates an operation of replacing an old transport unit 10. FIG. 9 shows a mode in which an old transport unit 10 is replaced. As shown in FIG. 9, in mounting a new transport unit 10 on the mount table 20, alignment of the transport unit 10 relative to the mount table 20 is completed as the engaging members 21 and the portions to be engaged 142 engage with each other. As a result, alignment of the tray T, positioned on the transport unit 10, relative to the mount table 20 is also completed. This facilitates an operation of replacing an old transport unit 10, and aligning the tray T in the X-direction. Although the portions to be engaged 142 are semicircular notches, they may have a circular shape or a shape with two lines forming a vertex (V groove shape).

The positioning reference portion 141 uses the positioning mechanism 13 (to be described later) to position the tray T (in the X-direction) as one end edge of the stage portion Tb of the tray T abuts against it. In other words, the positioning reference portion 141 guides transport of the tray T, and constitutes part of the positioning mechanism 13.

The positioning reference portion 141 and portions to be engaged 142 can be provided as independent members. However, as in this embodiment, since one guide member 14 includes the positioning reference portion 141 and portions to be engaged 142, it is possible to simultaneously perform alignment of the transport unit 10 relative to the mount table 20, and adjustment of the position at which the tray T is to be positioned.

<Transport Mechanism>

The transport mechanism 12 is supported by the base member 11, and transports the tray T as an object to be transported. In this embodiment, the transport mechanism 12 includes a pair of belt transmission mechanisms 12a supported on the inner sides of the side walls 112. Supporting the belt transmission mechanisms 12a on the inner sides of the side walls 112 makes it possible to accommodate the transport mechanism 12 in the internal space of the base member 11, thus downsizing and integrating the transport unit 10.

Each belt transmission mechanism 12a includes a drive source 121 such as a motor, a drive pulley 122 which is supported and rotated by the drive source 121, a driven pulley 123, and an endless belt 124 looped around the drive pulley 122 and driven pulley 123. The endless belt 124 travels upon rotation of the drive pulley 122. The tray T is suspended across the endless belts 124, and transported in the Y-direction as the endless belts 124 travel.

Each drive source 121 is supported by a support member 125. Each support member 125 includes an attachment portion 125a. Each attachment portion 125a has, for example, screw holes. Holes 112b are formed in the side walls 112 of the base member 11, and the support members 125 can be fastened to the side walls 112 by inserting bolts (not shown) into the holes 112b so that the bolts threadably engage with the attachment portions 125a. With this configuration, the side walls 112 can support the drive sources 121 and drive pulleys 122.

Each driven pulley 123 is rotatably supported by a shaft member 126. Each shaft member 126 has, for example, a screw hole. Holes 112c are formed in the side walls 112 of the base member 11. The shaft members 126 can be fastened to the side walls 112 by inserting bolts (not shown) into the holes 112c so that the bolts threadably engage with the shaft member 126. With this configuration, the side walls 112 can support the driven pulleys 123.

In this embodiment, the drive sources 121 and drive pulleys 122 are disposed on the side of one end of the base member 11 in the Y-direction, while the driven pulleys 123 are disposed on the side of the other end of the base member 11 in the Y-direction. With this configuration, the traveling range of the endless belts 124 can be set wide, thereby transporting the tray T from one end to the other end of the transport unit 10 in the Y-direction.

Also, the drive sources 121 such as motors generally occupy a large space. In this embodiment, the drive sources 121 are disposed on the side of one end of the base member 11 in the Y-direction, while the positioning mechanism 13 is disposed on the side of the other end of the base member 11 in the Y-direction with respect to the side walls 112. This makes it possible to efficiently use the space inside the base member 11, thus downsizing the transport unit 10.

In this embodiment, since the driven pulleys 123 have a diameter smaller than the drive pulleys 122, a larger number of other constituent elements can be arranged in the space inside the base member 11 on the side of the driven pulleys 123. In other words, a wider installation space can be ensured for the positioning mechanism 13. On the other hand, to horizontally transport the tray T, the positions of the shaft centers of the driven pulleys 123 shift to the side above that of the shaft centers of the drive pulleys 122 so that the endless belt 124 has a horizontally set, upper traveling portion 124a, and an obliquely set, lower traveling portion 124b.

Although the transport mechanism 12 is a belt transmission mechanism in this embodiment, it may be other types of transport mechanisms.

<Positioning Mechanism>

The positioning mechanism 13 is supported by the base member 11, and positions the tray T, transported by the transport mechanism 12, relative to the base member 11. In this embodiment, the positioning mechanism 13 positions the tray T in both the X- and Y-directions. However, the positioning mechanism 13 may position the tray T in one of the X- and Y-directions.

In this embodiment, the positioning mechanism 13 includes, as a configuration which positions the tray T in the Y-direction, a positioning reference portion 134, and a press mechanism 131 which presses the tray T so as to move the tray T toward the positioning reference portion 134. The positioning reference portion 134 and press mechanism 131 are used for the transport direction.

The positioning mechanism 13 also includes, as a configuration which positions the tray T in the X-direction, the positioning reference portion 141 arranged on the guide member 14, and a press mechanism 132 which presses the tray T so as to move the tray T toward the positioning reference portion 141. The positioning reference portion 141 and press mechanism 132 are used for a direction perpendicular to the transport direction.

In this embodiment, the positioning mechanism 13 includes a driving unit 133 common to the press mechanisms 131 and 132. Although a configuration in which the press mechanisms 131 and 132 include individual drive sources can also be adopted, the use of a common drive source allows space and cost saving corresponding to one drive source.

The positioning reference portion 134 and press mechanism 131 will be described first. Since the Y-direction for positioning coincides with the transport direction of the tray T, it is necessary to prevent interference with the tray T during transport.

The positioning reference portion 134 positions the tray T as one end of the bottom plate portion Ta of the tray T abuts against it from the Y-direction. In this embodiment, the positioning reference portion 134 has a circular cylindrical shape. The positioning reference portion 134 is moved in the Z-direction by a moving mechanism 134a. The moving mechanism 134a lifts/lowers the positioning reference portion 134 between a retreat position at which the tray T does not abut against it, and a positioning or butting position at which the tray T abuts against it. The retreat position is lower than the position (height) to which the tray T is transported by the transport mechanism 12, and the positioning position is a position at which the positioning reference portion 134 traverses the position to which the tray T is transported.

The moving mechanism 134a is an actuator such as a solenoid, and is supported by the bottom wall 111 of the base member 11. The positioning reference portion 134 is set at the positioning position in positioning the tray T, while it is set at the retreat position in other cases.

The press mechanism 131 includes a butting member 1312 which presses the tray T against the positioning reference portion 134 as the other end of the bottom plate portion Ta abuts against it from the Y-direction. The butting member 1312 includes a butting surface 1312a which abuts against the bottom plate portion Ta of the tray T. When the butting member 1312 is in an orientation shown in FIG. 5A, its butting surface 1312a abuts against a stopper 1315, that is, faces down. When the butting surface 1312a faces down, it is in a retracted state in which transport movement of the tray T is not hindered.

The butting member 1312 is pivotally supported by a support member 1314. More specifically, the support member 1314 includes a pair of shaft support members 1313, which support a shaft 1313a. The shaft 1313a extends through the butting member 1312, which can pivot about the shaft 1313a.

A slit 1314b is formed in the support member 1314, and the butting member 1312 can pass through the slit 1314b as it pivots about the shaft 1313a.

The stopper 1315 is fitted in the slit 1314b. The stopper 1315 abuts against the butting member 1312 to regulate its pivot operation.

An elastic member 1317 is disposed on the lower surface of the support member 1314. In this embodiment, the elastic member 1317 is a coil spring. The elastic member 1317 has its one end fixed to a fixing member 1317a, and its other end fixed to a fixing member 1317b. The fixing member 1317a is fixed to the support member 1314, while the fixing member 1317b is fixed to the butting member 1312. Therefore, the elastic member 1317 extends between the support member 1314 and the butting member 1312. Also, one side surface of the support member 1314 in the X-direction includes an engaging portion 1314a to serve as a cam surface. The engaging portion 1314a includes a linear portion which positions a butting member 1321 in a retracted state, and a recessed portion (a portion notched on the side of the guide member 14 (see FIG. 3) with respect to the linear portion) which positions the butting member 1321 in a positioned state. The linear portion and recessed portion continuously communicate with each other via a sloped portion.

A regulating member 1311 has its one end supported by the bottom wall 111 of the base member 11, and its other end including a butting portion 1311a. The butting portion 1311a abuts against the butting member 1312 to regulate its pivot operation.

The driving unit 133 is an actuator which advances/retreats an L-shaped movable portion 133a in the Y-direction while its main body portion is fixed to the bottom wall 111 of the base member 11, and is, for example, an electric cylinder. The support member 1314 is fixed to the movable portion 133a, and movably supported by the bottom wall 111 of the base member 11 through the driving unit 133. As the movable portion 133a advances/retreats in the Y-direction, the support member 1314 also advances/retreats. As a result, the butting member 1312 also advances/retreats in the Y-direction.

The press mechanism 132 will be described below. The press mechanism 132 includes a pair of butting members 1321 spaced apart from each other in the Y-direction. Each butting member 1321 includes a butting portion 1321a at its upper end (one end). The butting portion 1321a has a distal end surface curved in an arc as viewed from the top. The butting portion 1321a abuts against the end edge (side surface) of the stage portion Tb of the tray T from the X-direction. In this embodiment, the butting portion 1321a abuts against one side surface of the stage portion Tb of the tray T, while the positioning reference portion 141 abuts against the other side surface of the stage portion Tb of the tray T, thereby positioning the tray T in the X-direction while it is sandwiched between the butting portion 1321a and the positioning reference portion 141.

Each butting member 1321 is supported by a support mechanism 1322, supported by the bottom wall 111 of the base member 11, to be movable in the X-direction. The support mechanism 1322 is fixed to the bottom wall 111 of the base member 11, and includes a rail member 1322a extending in the X-direction, and a slide member 1322b slidable on the rail member 1322a. The lower end (other end) of the butting members 1321 is fixed to the slide member 1322b, and can reciprocally move in the X-direction together with the slide member 1322b.

In this embodiment, each butting member 1321 extends to the exterior of the base member 11 upon passing through the side walls 112 of the base member 11, and is curved in a C shape so as to return onto the base member 11. More specifically, opening portions 112a through which the butting members 1321 can pass are formed in one of the pair of side walls 112 of the base member 11, as shown in FIG. 3. The lower end of each butting member 1321 extends through the opening portion 112a from the exterior of the base member 11, and is connected to the slide member 1322b, as shown in FIG. 4.

Forming each butting member 1321 in the above-mentioned shape makes it possible to downsize the transport unit 10 while positioning the tray T in the X-direction. In addition, except the butting members 1321, the transport mechanism 12 and positioning mechanism 13 can be accommodated in the internal space of the base member 11 to integrate them with the transport unit 10. This facilitates handling of the transport unit 10.

Referring to FIGS. 5A and 5B, a support member 1323 which supports a cam follower 1323a is fixed to each butting member 1321, so the cam follower 1323a substantially constitutes part of the butting member 1321. The cam follower 1323a engages with the engaging portion 1314a of the support member 1314.

Each butting member 1321 is always biased against the positioning reference portion 141 (the support member 1314 in FIGS. 5A and 5B) by a corresponding biasing mechanism 1324. In this embodiment, the biasing mechanism 1324 is a spring plunger, and is supported by the bottom wall 111 of the base member 11 through a support member 1325. The biasing mechanism 1324 has a cylinder portion fixed to the support member 1325, and a plunger portion which abuts against the support member 1323 to press it against the positioning reference portion 141. Hence, each butting member 1321 can independently abut against one side portion of the stage portion Tb of the tray T to make the tray T abut against the positioning reference portion 141 by an appropriate biasing force. Although the biasing mechanism 1324 is a spring plunger in this embodiment, it may be formed by rubber or a spring alone, which extends between the butting member 1321 and the base member 11.

<Operation of Positioning Mechanism>

Figures 6A, 6B:
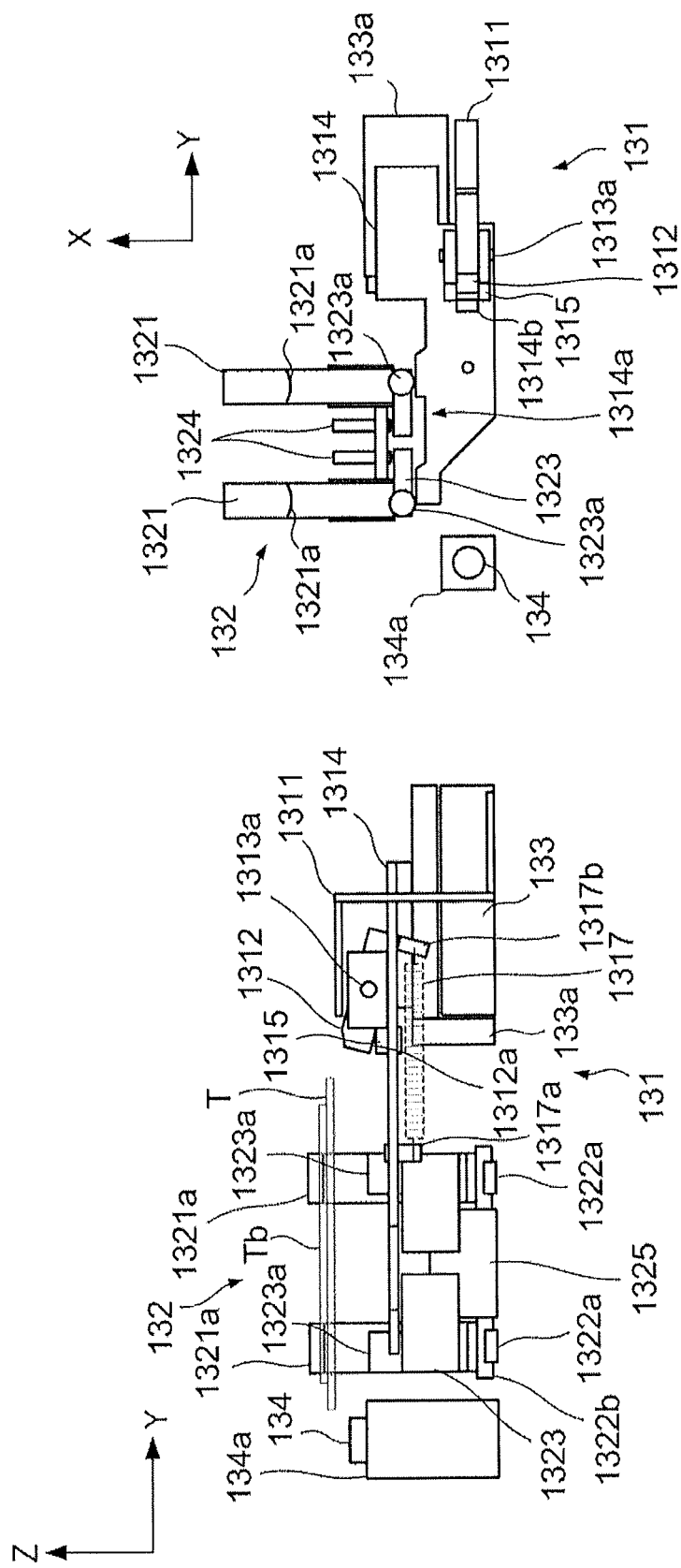
FIGS. 6A and 6B are views for explaining the operation of the positioning mechanism shown in FIGS. 5A and 5B.

The positioning operation of the tray T by the positioning mechanism 13 will be described with reference to FIGS. 6A to 8B. Of FIGS. 6A to 8B, FIGS. 6A, 7A, and 8A are views showing the positioning mechanism 13 as viewed from the side, and FIGS. 6B, 7B, and 8B are views showing the positioning mechanism 13 as viewed from the top. Note that the positioning reference portion 141 is not shown in FIGS. 6A to 8B. The tray T is not shown in FIGS. 6B, 7B, and 8B, either.

FIGS. 6A and 6B show a state before positioning, that is, a state in which a new tray T is transported. Note that during positioning, the transport mechanism 12 is kept stopped, and the tray T is mounted on the endless belts 124.

First, referring mainly to FIG. 6A, attention will be paid to the press mechanism 131 and positioning reference portion 134 which position the tray T in the Y-direction.

The positioning reference portion 134 is at a retreat position, at which it does not interfere with the tray T. The support member 1314 is at the retreat position on the right side of FIG. 6A. The butting member 1312 is always biased by the elastic member 1317 with a pivot force acting clockwise in FIG. 6A. However, the regulating member 1311 regulates the pivot operation of the butting member 1312, and the butting surface 1312a is at a retreat position (in a horizontal orientation) at which it abuts against the stopper 1375. The retreat position is a position (on the side of the bottom wall 111) lower than a tray transport plane in which the butting member 1312 does not interfere with the tray T.

Next, referring mainly to FIG. 6B, attention will be paid to the press mechanism 132 which positions the tray T in the X-direction. Each butting member 1321 is biased against the lower side (the side of the X positioning reference portion) in FIG. 6B by the corresponding biasing mechanism 1324. However, since each cam follower 1323a engages with the linear portion of the engaging portion 1314a, each butting member 1321 is not movable and is at the retreat position. At the retreat position, the tray T cannot be pressed against the positioning reference portion 141.

FIGS. 7A and 7B show a state at the start of positioning. First, referring mainly to FIG. 7A, attention will be paid to the press mechanism 131 and positioning reference portion 134 which position the tray T in the Y-direction.

Upon actuation of the moving mechanism 134a, the positioning reference portion 134 moves to a positioning position, at which it interferes with the tray T. Upon driving of the driving unit 133, the movable portion 133a starts to extend (to the left in FIG. 7A) in the Y-direction (to the side of the positioning reference portion 134). Hence, the support member 1314 also advances to the left in FIG. 7A from the retreat position. As the support member 1314 advances, the butting member 1312 also advances to the left in FIG. 7A. On the other hand, the regulating member 1311 stays in position without advancing, so the butting member 1312 and regulating member 1311 start to separate from each other. As a result, upon biasing of the elastic member 1317, the butting member 1312 starts to pivot clockwise in FIG. 7A.

Next, referring mainly to FIG. 7B, attention will be paid to the press mechanism 132 which positions the tray T in the X-direction. Upon movement of the support member 1314, each cam follower 1323a still engages with the linear portion of the engaging portion 1314a and does not reach the recessed portion in the engaging portion 1314a, despite a change in position at which the cam follower 1323a engages with the engaging portion 1314a. Therefore, each butting member 1321 stays at the retreat position.

FIGS. 8A and 8B show a state after positioning. First, referring mainly to FIG. 8A, attention will be paid to the press mechanism 131 and positioning reference portion 134 which position the tray T in the Y-direction.

The positioning reference portion 134 stays at the positioning position. Upon driving of the driving unit 133, the movable portion 133a further moves in the Y-direction from the state shown in FIGS. 7A and 7B. In other words, the driving unit 133 further extends as a whole. Hence, the support member 1314 also further advances to the left in FIG. 8A from the retreat position. Upon further advancing of the support member 1314, the butting member 1312 also further advances to the left in FIG. 8A. The butting member 1312 and regulating member 1311 sufficiently separate from each other. As a result, upon biasing of the elastic member 1317, the butting member 1312 completes its clockwise pivot operation in FIG. 8A and is positioned at the positioning position. At this time, the butting member 1312 is in an upright orientation. The butting surface 1312a abuts against the tray T to press it against the positioning reference portion 134. As a result, the positioning operation of the tray T in the Y-direction is completed.

Next, referring mainly to FIG. 8B, attention will be paid to the press mechanism 132 which positions the tray T in the X-direction. Upon movement of the support member 1314, the position at which each cam follower 1323a engages with the engaging portion 1314a further changes, and reaches the recessed portion in the engaging portion 1314a. Upon biasing of each biasing mechanism 1324, each butting member 1321 moves to the positioning position on the lower side in FIG. 8B. At this time, the butting portion 1321a abuts against the stage portion Tb of the tray T to press the tray T against the positioning reference portion 141. As a result, the positioning operation of the tray T in the X-direction is also completed.

In this embodiment, the positioning operations of the tray T in the X- and Y-directions are thus completed (positioning ON state). Hence, the transfer device 6 shown in FIG. 1 can prevent a position shift of each component when this component is transported to each recessed portion Tc in the tray T. Then, when the movable portion 133a is retreated by driving the driving unit 133, the entire driving unit 133 contracts, so the positioning mechanism 13 returns to the state shown in FIGS. 6A and 6B, in which the transport mechanism 12 is ready to transport the tray T. That is, upon retreat of the support member 1314, each cam follower 1323a separates from the recessed portion in the engaging portion 1314a and engages with the linear portion, so each butting member 1321 moves in the direction, opposite to the biasing direction of the biasing mechanism 1324, from the engaging portion 1314a, and returns to the retreat position. Also, the butting member 1312 returns to the retreat position as the regulating member 1311 abuts against it (positioning OFF state).

In this embodiment, with the advancing/retreating operation of the support member 1314, the butting member 1312 advances/retreats in the Y-direction, and the butting member 1312 interlocks with this advancing/retreating operation to move (pivot) between a retreat position at which it does not abut against the tray T, and a positioning position at which it abuts against the tray T, so as not to hinder transport of the tray T by the butting member 1312 during transport of the tray T. The support member 1314, elastic member 1317, and regulating member 1311 constitute a driving mechanism (or actuating mechanism) which interlocks with the advancing/retreating operation of the butting member 1312 to move (pivot) the butting member 1312 between the retreat position and the positioning position.

<Maintenance and Other Operations of Transport Unit 10>

In this embodiment, the transport unit 10 includes constituent elements such as the transport mechanism 12 and positioning mechanism 13, but can be integrally accommodated in the base member 11 in a small space and is easy to handle. When the transport mechanism 12 or positioning mechanism 13 of a given transport unit 10 requires maintenance, the transport unit 10 need only be replaced with a new transport unit 10 as a whole. Since both the transport mechanism 12 and positioning mechanism 13 are supported by the base member 11, their position adjustment is completed when the transport unit 10 has been assembled.

Hence, in an operation of replacing an old transport unit 10, it is unnecessary to adjust the positions of the transport mechanism 12 and the positioning mechanism 13 relative to each other. This makes it possible to prevent prolongation of the downtime of the work system A.

Also, in an operation of replacing an old transport unit 10, an operation of finely adjusting the position of the tray T relative to the mount table 20 is necessary, but can be easily performed (is made substantially unnecessary) by providing the engaging members 21 and portions to be engaged 142 on the guide member 14, as shown in FIG. 9. Therefore, in a configuration equipped with the engaging members 21 and portions to be engaged 142, there is no need to perform a position designation operation of recognizing the positions of the recessed portions Tc relative to the transfer device 6 for every replacement of the transport unit 10. This makes it possible to more reliably prevent prolongation of the downtime of the work system A.

<Control Device>

FIG. 10 is a block diagram showing a control device 200 of the work system A. The control device 200 controls the overall work system A in accordance with instructions from a host computer 210. The control device 200 outputs control commands to controllers individually provided to the work device 3, standby device 5, inspection device 7, device 9, and each transport apparatus 220 to control them. Each transport apparatus 220 includes the transport devices described with reference to FIG. 1, and includes the transport units 10. The controller of the transport unit 10 may be provided for each transport unit 10 or each transport apparatus 1.

The control device 200 includes a processing unit 201, storage unit 202, and interface unit 203, and are connected to each other via a bus (not shown). The processing unit 201 executes a program stored in the storage unit 202. The processing unit 201 is, for example, a CPU. The storage unit 202 is, for example, a RAM, a ROM, or a hard disk. The interface unit 203 includes, for example, a communication interface which allows communication between the processing unit 201 and the host computer 210, and that which allows communication between the processing unit 201 and each controller.

The storage unit 202 may store the arrangement information and ON/OFF information of each transport unit 10. The ON/OFF information can include information indicating the enabling/disabling of each transport unit 10. Control preferably is done so as to prevent an empty tray T from being transported to a disabled transport unit 10 due, for example, to a breakdown or requirement of a replacement operation. Hence, even while some transport units 10 are replaced, it is unnecessary to stop the overall work system A. Also, as the positions of the recessed portions Tc in the tray T in the positioning ON state set by each transport unit 10 transported by the transfer device 6 are designated in advance and stored in the storage unit 202, IC chips inspected by the inspection device 7 can be accommodated in the recessed portions Tc in the tray T based on the inspection result.

Second Embodiment

Figure 11:
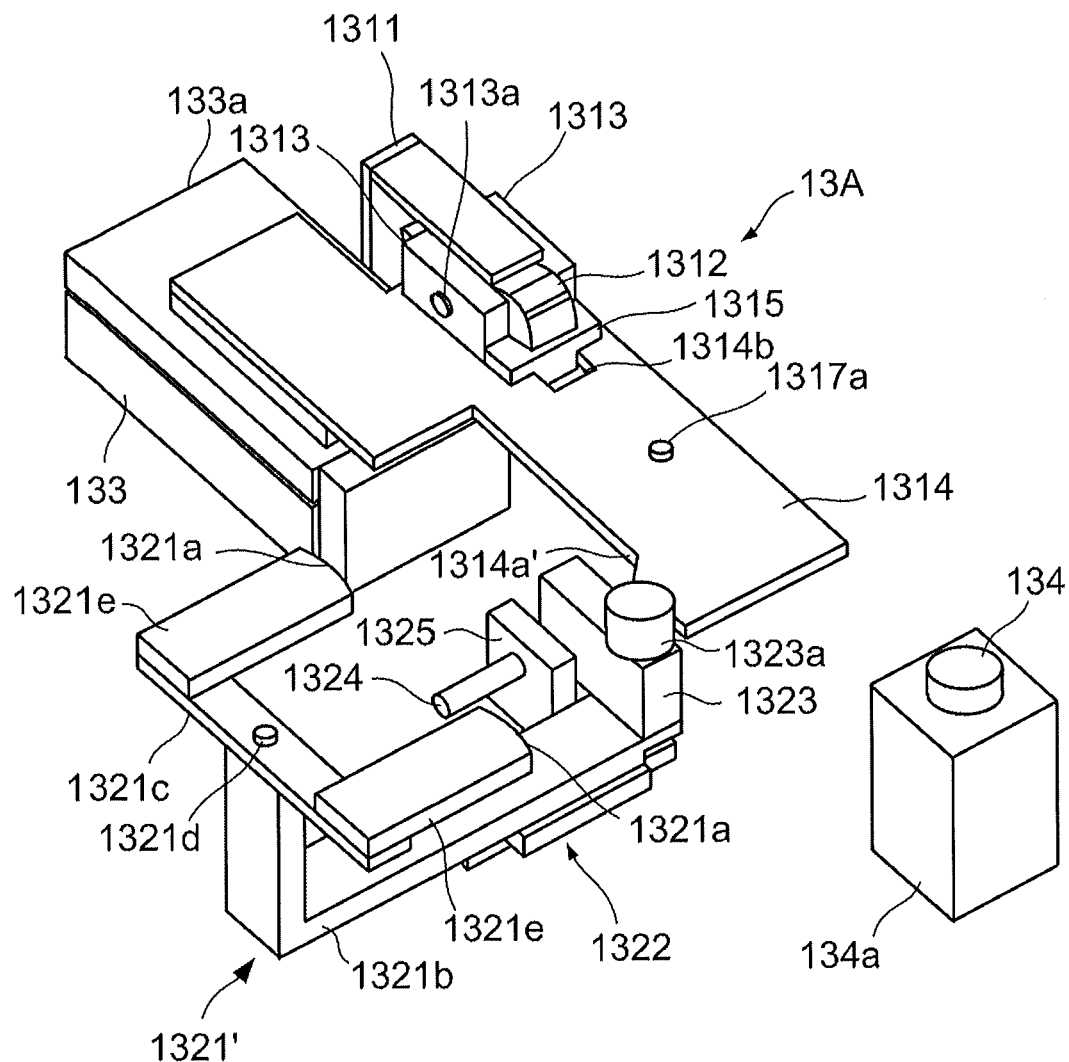
FIG. 11 is a perspective view for explaining another example of the positioning mechanism.

Although two sets of a butting member 1321 and a support mechanism 1322 are provided so that each butting member 1321 is independently movable in the above-mentioned first embodiment, one set of a butting member 1321 and a support mechanism 1322 may be provided. FIG. 11 illustrates an example of the latter configuration.

In an example shown in FIG. 11, a positioning mechanism 13A includes one set of a butting member 1321' and a support mechanism 1322. Because one butting member 1321' is used, one cam follower 1323a, one support member 1323 which supports the cam follower 1323a, and one biasing mechanism 1324 are used. Also, because one cam follower 1323a is used, an engaging portion 1314a' of a support member 1314 has a shape different from that of the engaging portion 1314a in the above-mentioned first embodiment.

The butting member 1321' includes an L-shaped main body portion 1321b, an arm portion 1321c which is connected to the main body portion 1321b via a shaft 1321d and is pivotally movable about the shaft 1321d, and butting portion forming members 1321e fixed to the two ends, respectively, of the arm portion 1321c. Butting portions 1321a are the distal ends of the butting portion forming members 1321e, and these distal end portions (butting portions) are formed in a curved shape. Other constituent elements of the positioning mechanism 13A are the same as in the positioning mechanism 13 according to the above-mentioned first embodiment.

In this embodiment, one set of a butting member 1321' and a support mechanism 1322 is used, while two butting portions 1321a are used, as in the above-mentioned first embodiment. Unlike the above-mentioned first embodiment, each butting portion 1321a does not independently move, but the arm portion 1321c is pivotally movable about the shaft 1321d, so the relative position of each butting portion 1321a can change. Hence, each butting portion 1321a can abut against a stage portion Tb of a tray T to the same degree despite a simple configuration.

Third Embodiment

Figure 12:
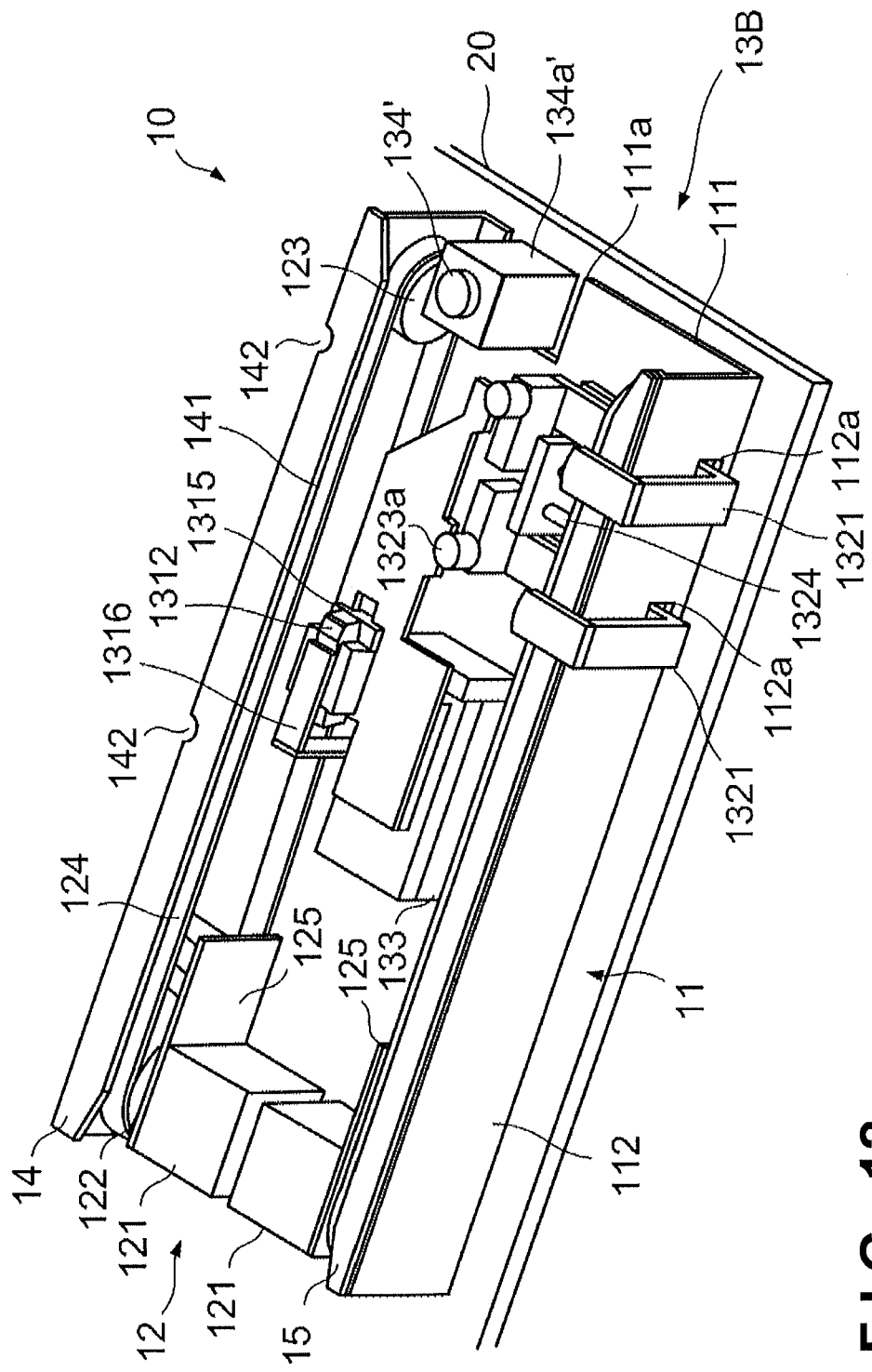
FIG. 12 is a perspective view for explaining still another example of the positioning mechanism.

Although the positioning reference portion 134 and moving mechanism 134a are arranged on the transport unit 10 in the above-mentioned first embodiment, they may be arranged at predetermined positions on the mount table 20 on which the transport units 10 are mounted. FIG. 12 illustrates an example of the latter configuration.

In an example shown in FIG. 12, a notch-shaped opening portion 111*a* is formed in a bottom wall 111 of a base member 11. A positioning mechanism 13B is the same as the positioning mechanism 13, except for a positioning reference portion 134' and a moving mechanism 134*a'*. The positioning reference portion 134' and moving mechanism 134*a'* have the same configurations as the positioning reference portion 134 and moving mechanism 134*a*, respectively, and they are different only in their arrangements from the latter in which the moving mechanism 134*a'* is fixed to the mount table 20 in the opening portion 111*a*. This makes it possible to form a simpler configuration of a transport unit 10. It is also possible to facilitate re-positioning of a tray T.

Fourth Embodiment

Figure 13:
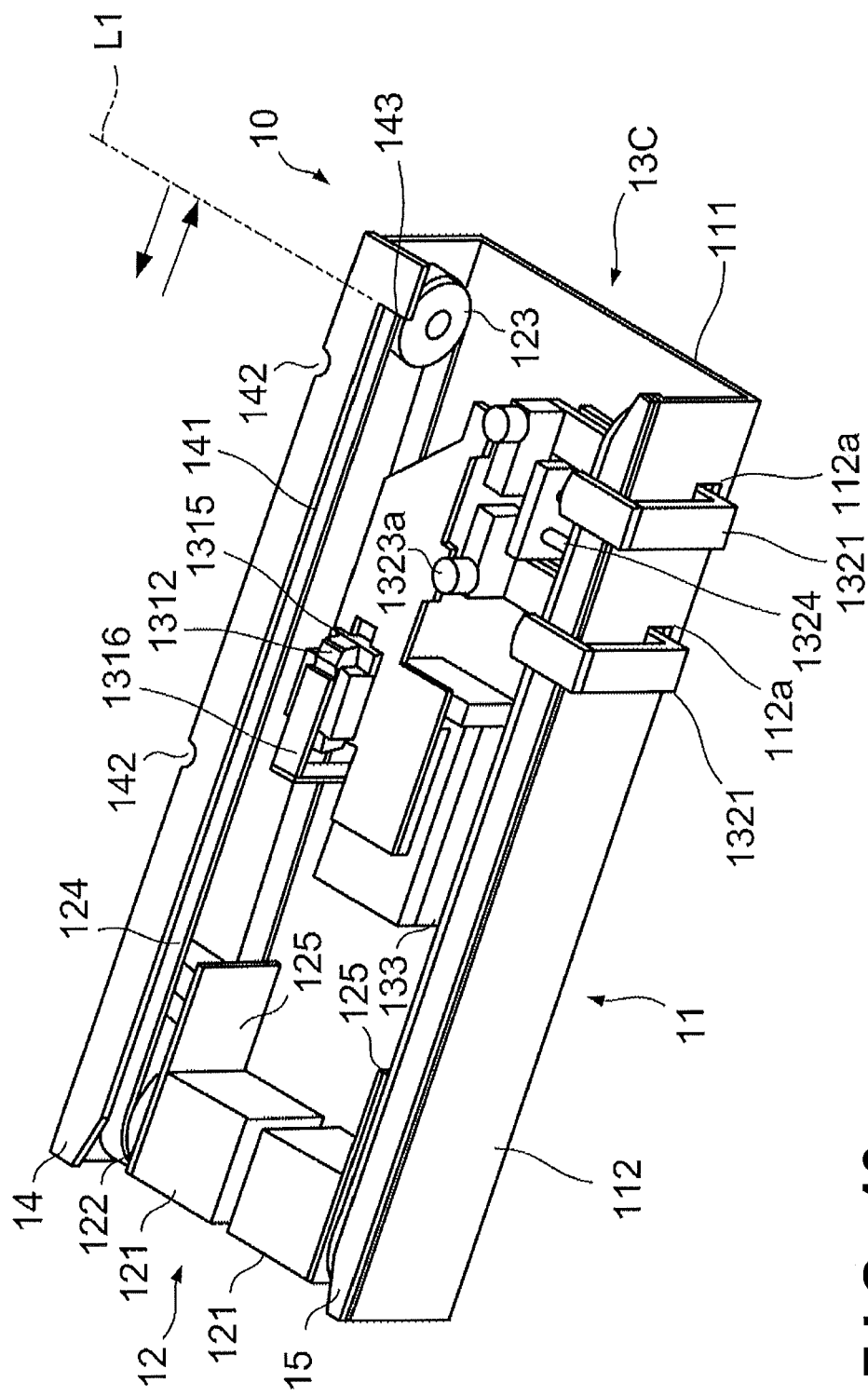
FIG. 13 is a perspective view for explaining still another example of the positioning mechanism.

Although the positioning reference portion 134 can be moved by the moving mechanism 134*a* in the above-mentioned first embodiment, it may be fixed in position. FIG. 13 illustrates an example of the position of the positioning reference portion 134.

In an example shown in FIG. 13, a guide member 14 includes a positioning reference portion 143, in addition to a positioning reference portion 141. The positioning reference portion 143 substitutes for the positioning reference portion 134, and a positioning mechanism 13C according to this embodiment includes no moving mechanism 134*a*.

Although the positioning operation by the positioning mechanism 13C is the same as in the above-mentioned first embodiment, the positioning reference portion 143 stays in position, so a tray T cannot be transported past the positioning reference portion 143. Therefore, the tray T is transported while turning back from the positioning reference portion 143, as indicated by a line L1. With such a configuration, the relationship between reference positions in the X- and Y-directions is set by one member, so it is possible to form a simpler configuration of a transport unit 10. It is also possible to facilitate re-alignment of the tray T.

Other Embodiments

In the above-mentioned first to third embodiments, in positioning the tray T in the Y-direction, a reference position is defined by disposing the positioning reference portion 134 and moving mechanism 134*a* at positions below the transport surface of the tray T, and extending the positioning reference portion 134 on the transport track so as to make it abut against one end of the bottom plate portion Ta of the tray T. However, the positioning reference portion 134 and moving mechanism 134*a* may be disposed at positions to the side of or above the tray T to extend the positioning reference portion 134 on the transport track. By disposing the positioning reference portion 134 and moving mechanism 134*a* at positions to the side of or above the tray T, the positioning reference portion 134 can abut against one end, in the Y-direction, of the stage portion Tb of the tray T. Similarly, in the above-mentioned first to fourth embodiments, the butting member 1312 of the press mechanism 131 on the biasing side in positioning the tray T in the Y-direction may be disposed to the side of or above the tray T to extend it on the transport track.

Although an example in which the transport apparatus 1 and transport unit 10 are applied to the work system A has been exemplified in the above-mentioned embodiments, the present invention is applicable to various systems. The tray T is merely an example of the object to be transported.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-077770, filed Mar. 29, 2012, which is hereby incorporated by reference herein in its entirety.

What is claimed is:

1. A transport unit comprising:
   a base member including a bottom wall extending in a transport direction, and a pair of side walls standing upright from two side portions, respectively, of said bottom wall;
   a transport mechanism which is supported by said base member, and transports an object to be transported; and
   a positioning mechanism which is supported by said base member, and positions the object, transported by said transport mechanism, relative to said base member,
   wherein said positioning mechanism includes:
      a first reference portion configured to position the object in a direction perpendicular to the transport direction;
      a second reference portion configured to position the object in the transport direction;
      a first press mechanism which presses the object toward said first reference portion; and
      a second press mechanism which presses the object toward said second reference portion, and
   wherein said second press mechanism includes:
      a butting member which abuts against the object from the transport direction, and
      a driving mechanism which advances/retreats said butting member in the transport direction, and interlocks with an advancing/retreating operation of said butting member to move said butting member between a retreat position at which the object does not abut against said butting member, and a positioning position at which the object abuts against said butting member.

2. The unit according to claim 1, wherein said positioning mechanism includes a moving mechanism which moves said second reference portion between the retreat position at which the object does not abut against said butting member, and the positioning position at which the object abuts against said butting member.

3. A transport unit comprising:
   a base member including a bottom wall extending in a transport direction, and a pair of side walls standing upright from two side portions, respectively, of said bottom wall;
   a transport mechanism which is supported by said base member, and transports an object to be transported; and
   a positioning mechanism which is supported by said base member, and positions the object, transported by said transport mechanism, relative to said base member,
   wherein said positioning mechanism includes:
      a first reference portion configured to position the object in a direction perpendicular to the transport direction;
      a second reference portion configured to position the object in the transport direction;
      a first press mechanism which presses the object toward said first reference portion;
      a second press mechanism which presses the object toward said second reference portion; and a driving unit common to said first press mechanism and said second press mechanism, wherein said first press mechanism includes:
- a first butting member which abuts against the object,
- a support mechanism which supports said first butting member to be movable in the perpendicular direction, and
- a biasing mechanism which always biases said first butting member against said first reference portion, wherein said second press mechanism includes:
- a second butting member which abuts against the object from the transport direction, and
- an actuating mechanism which advances/retreats said second butting member in the transport direction, and interlocks with an advancing/retreating operation of said second butting member to move said second butting member between a retreat position at which the object does not abut against said second butting member, and a positioning position at which the object abuts against said second butting member, wherein said actuating mechanism includes:
- a support member which advances/retreats in the transport direction by said driving unit, and supports said second butting member to be movable between the retreat position and the positioning position, and wherein said support member includes:
- an engaging portion which engages with said first butting member, and moves said first butting member in a direction, opposite to a direction in which said biasing mechanism biases said first biasing member, in accordance with an advancing/retreating operation of said first butting member.

4. The unit according to claim 3, wherein
said second press mechanism, said support mechanism, and said biasing mechanism are supported by said bottom wall, and
said first butting member has one end supported by said support mechanism, and the other end which abuts against the object and has a curved shape which passes through an opening portion formed in one of said side walls.

5. The unit according to claim 1, wherein said transport mechanism includes a pair of belt transmission mechanisms supported by inner sides of said pair of side walls, respectively.

6. The unit according to claim 5, wherein
each of said pair of belt transmission mechanisms includes a drive source,
said drive source is disposed on a side of one end of said base member in the transport direction, and
said positioning mechanism is disposed on a side of the other end of said base member in the transport direction with respect to said drive sources.

7. The unit according to claim 1, wherein said first press mechanism includes:
- a first butting member which abuts against the object from the direction perpendicular to the transport direction; and
- a biasing mechanism which always biases said first butting member against said first reference portion.

8. The unit according to claim 1, wherein said driving mechanism includes:
- a driving unit; and
- a support member which advances/retreats in the transport direction by said driving unit, and supports said butting member to be movable between the retreat position and the positioning position.

9. The unit according to claim 8, wherein said first press mechanism includes a first butting member which abuts against the object from the direction perpendicular to the transport direction, and
said support member includes an engaging portion which serves as a cam surface and engages with said first butting member.

10. The unit according to claim 1, further comprising a reference portion which includes the first reference portion and the second reference portion.

\* \* \* \* \*